US011870413B2

(12) United States Patent
Li (10) Patent No.: US 11,870,413 B2
(45) Date of Patent: Jan. 9, 2024

(54) ANTENNA STRUCTURE AND COMMUNICATIONS TERMINAL

(71) Applicant: VIVO MOBILE COMMUNICATION CO., LTD., Guangdong (CN)

(72) Inventor: Rihui Li, Dongguan (CN)

(73) Assignee: VIVO MOBILE COMMUNICATION CO., LTD., Dongguan (CN)

( * ) Notice: Subject to any disclaimer, the term of this patent is extended or adjusted under 35 U.S.C. 154(b) by 393 days.

(21) Appl. No.: 17/343,985

(22) Filed: Jun. 10, 2021

(65) Prior Publication Data

US 2021/0305962 A1 Sep. 30, 2021

Related U.S. Application Data

(63) Continuation of application No. PCT/CN2019/117446, filed on Nov. 12, 2019.

(30) Foreign Application Priority Data

Dec. 12, 2018 (CN) .......................... 201811519716.7

(51) Int. Cl.
*H01Q 5/371* (2015.01)
*H03H 7/38* (2006.01)
(Continued)

(52) U.S. Cl.
CPC ............ *H03H 7/38* (2013.01); *H01Q 1/2291* (2013.01); *H01Q 9/045* (2013.01)

(58) Field of Classification Search
CPC ........ H01Q 1/243; H01Q 21/28; H01Q 5/328; H01Q 1/521; H01Q 5/378; H01Q 5/335;
(Continued)

(56) References Cited

U.S. PATENT DOCUMENTS 7,164,387 B2 * 1/2007 Sievenpiper ............. H01Q 9/14
343/866
9,531,061 B2 * 12/2016 Han ....................... H01Q 1/243
(Continued)

FOREIGN PATENT DOCUMENTS

CN 103201906 A 7/2013
CN 204407515 U 6/2015
(Continued)

OTHER PUBLICATIONS

International Search Report and Written Opinion of the International Searching Authority regarding International Patent Application No. PCT/CN2019/117446, dated Feb. 3, 2020. Translation provided by Bohui Intellectual Property.
(Continued)

*Primary Examiner* — Linh V Nguyen
(74) *Attorney, Agent, or Firm* — Harness, Dickey & Pierce, P.L.C.

(57) ABSTRACT

An antenna structure includes a first antenna radiator, a second antenna radiator, a first impedance matching circuit, a second impedance matching circuit, and a signal source, wherein the first antenna radiator is coupled to the second antenna radiator by means of a slot; the end of the first antenna radiator away from the slot is grounded, and the first antenna radiator is provided with a feed point, the end of the second antenna radiator away from the slot is grounded; a first end of the first impedance matching circuit is connected to the feed point, and a second end of the first impedance matching circuit is connected to a first end of the signal source; a first end of the second impedance matching circuit is connected to a third end of the first impedance matching circuit, and a second end of the second impedance matching circuit is grounded.

20 Claims, 5 Drawing Sheets

(51) Int. Cl.
*H01Q 1/22* (2006.01)
*H01Q 9/04* (2006.01)

(58) Field of Classification Search
CPC .......... H01Q 13/10; H01Q 5/50; H01Q 5/307; H01Q 5/35; H01Q 9/0442; H01Q 13/103; H01Q 9/045; H01Q 9/145; H01Q 5/321; H01Q 13/106; H01Q 1/245; H01Q 1/242; H01Q 9/30; H01Q 23/00; H01Q 5/28; H01Q 5/314; H01Q 5/385
USPC .................. 341/702, 700 MS, 860; 343/702, 343/700 MS, 860
See application file for complete search history.

(56) References Cited

U.S. PATENT DOCUMENTS

| | | | |
|---|---|---|---|
| 9,608,314 B1* | 3/2017 | Kwon | H01Q 1/521 |
| 9,728,858 B2* | 8/2017 | Zhu | H01Q 1/243 |
| 9,935,359 B2* | 4/2018 | Kim | H01Q 1/38 |
| 11,038,257 B2* | 6/2021 | Zhu | H01Q 1/243 |
| 11,101,827 B2* | 8/2021 | Kim | H01Q 5/35 |
| 2006/0261911 A1 | 11/2006 | Fukuda et al. | |
| 2008/0316115 A1* | 12/2008 | Hill | H01Q 21/30 343/702 |
| 2009/0115674 A1* | 5/2009 | Fujieda | H01Q 5/371 343/745 |
| 2009/0278755 A1 | 11/2009 | Shoji | |
| 2010/0053007 A1* | 3/2010 | Ni | H01Q 9/0421 343/745 |
| 2011/0183633 A1* | 7/2011 | Ohba | H01Q 5/314 343/722 |
| 2011/0309994 A1 | 12/2011 | Kato et al. | |
| 2013/0201071 A1 | 8/2013 | Uchida | |
| 2016/0233574 A1* | 8/2016 | Xiong | H01Q 1/2258 |
| 2018/0026361 A1* | 1/2018 | Sakong | H01Q 1/48 343/860 |
| 2020/0076080 A1* | 3/2020 | Liu | H01Q 21/28 |
| 2020/0099125 A1 | 3/2020 | Ying et al. | |

FOREIGN PATENT DOCUMENTS

| | | | |
|---|---|---|---|
| CN | 104993241 A | 10/2015 | |
| CN | 105305028 A | 2/2016 | |
| CN | 105789881 A | 7/2016 | |
| CN | 205509017 U | 8/2016 | |
| CN | 107331979 A | 11/2017 | |
| CN | 107959106 A | 4/2018 | |
| CN | 108346863 A | 7/2018 | |
| CN | 108417980 A | 8/2018 | |
| CN | 108631041 * | 10/2018 | ............ H01Q 5/335 |
| CN | 108631041 A | 10/2018 | |
| CN | 108713277 A | 10/2018 | |
| CN | 108963445 A | 12/2018 | |
| CN | 109659693 A | 4/2019 | |
| EP | 3644441 A1 | 4/2020 | |
| JP | H07221529 A | 8/1995 | |

OTHER PUBLICATIONS

First Office Action regarding Chinese Patent Application No. 201811519716.7, dated Jan. 22, 2020. Translation provided by Bohui Intellectual Property.
Second Office Action regarding Chinese Patent Application No. 201811519716.7, dated Sep. 30, 2020. Translation provided by Bohui Intellectual Property.
Third Office Action regarding Chinese Patent Application No. 201811519716.7, dated Apr. 6, 2021. Translation provided by Bohui Intellectual Property.
Supplementary European Search Report regarding Patent Application No. 19896124.5-1205/3896791; PCT/CN2019/117446, dated Jan. 14, 2022.

* cited by examiner

ANTENNA STRUCTURE AND COMMUNICATIONS TERMINAL

CROSS-REFERENCE TO RELATED APPLICATIONS

This application is a Bypass Continuation Application of PCT/CN2019/117446 filed on Nov. 12, 2019, which claims priority to Chinese Patent Application No. 201811519716.7 filed on Dec. 12, 2018, which are incorporated herein by reference in their entirety.

TECHNICAL FIELD

The present disclosure relates to the field of communications technologies, and in particular, to an antenna structure and a communications terminal.

BACKGROUND

With rapid development of terminal technologies, a communications terminal has become an indispensable tool in people's life, and brings great convenience to all aspects of user's life. An antenna is usually disposed in a common communications terminal with a metal middle frame or an all-metal battery cover in daily life, and the antenna may work in a plurality of frequency bands, for example, may work in frequency band ranges of 1.55 GHz to 1.62 GHz, 2.4 GHz to 2.5 GHz, and 5.15 GHz to 5.85 GHz.

However, in the related art, a voltage standing wave ratio of the antenna is relatively large, resulting in relatively poor performance of the antenna.

SUMMARY

According to a first aspect, an embodiment of the present disclosure provides an antenna structure, including a first antenna radiator, a second antenna radiator, a first impedance matching circuit, a second impedance matching circuit, and a signal source, where the first antenna radiator is coupled to the second antenna radiator through a slot, an end of the first antenna radiator away from the slot is grounded, a feed point is disposed on the first antenna radiator, an end of the second antenna radiator away from the slot is grounded, a length of the first antenna radiator is greater than a length of the second antenna radiator, and an absolute value of a difference between a length of the second antenna radiator and a ¼ wavelength of a third frequency band is less than a first specific value;

a first terminal of the first impedance matching circuit is connected to the feed point, and a second terminal of the first impedance matching circuit is connected to a first terminal of the signal source;

a first terminal of the second impedance matching circuit is connected to a third terminal of the first impedance matching circuit, and a second terminal of the second impedance matching circuit is grounded; and a second terminal of the signal source is grounded.

According to a second aspect, an embodiment of the present disclosure further provides a communications terminal, including the foregoing antenna structure.

BRIEF DESCRIPTION OF DRAWINGS

To describe the technical solutions in the embodiments of the present disclosure more clearly, the following briefly describes the accompanying drawings required in the embodiments of the present disclosure. Apparently, the accompanying drawings in the following descriptions show merely some embodiments of the present disclosure, and a person of ordinary skill in the art may still derive other drawings from these accompanying drawings.

DESCRIPTION OF EMBODIMENTS

The following clearly describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure shall fall within the protection scope of the present disclosure.

Figure 1:
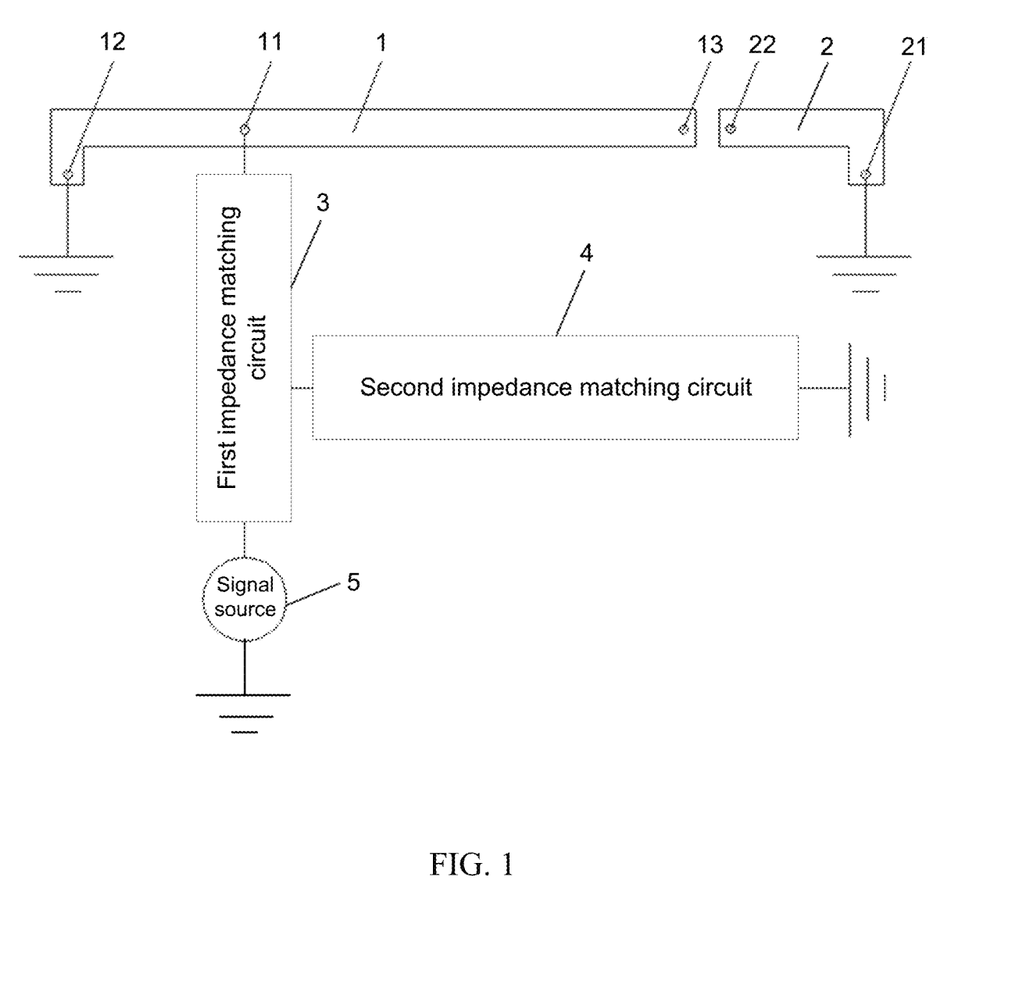
FIG. 1 is a schematic structural diagram 1 of an antenna structure according to an embodiment of the present disclosure.

Referring to FIG. 1, FIG. 1 is a schematic structural diagram 1 of an antenna structure according to an embodiment of the present disclosure. As shown in FIG. 1, the antenna structure includes a first antenna radiator 1, a second antenna radiator 2, a first impedance matching circuit 3, a second impedance matching circuit 4, and a signal source 5. The first antenna radiator 1 is coupled to the second antenna radiator 2 through a slot, an end of the first antenna radiator 1 away from the slot is grounded, a feed point 11 is disposed on the first antenna radiator 1, an end of the second antenna radiator 2 away from the slot is grounded, a length of the first antenna radiator 1 is greater than a length of the second antenna radiator 2, and an absolute value of a difference between a length of the second antenna radiator 2 and a ¼ wavelength of a third frequency band is less than a first specific value. A first terminal of the first impedance matching circuit 3 is connected to the feed point 11, and a second terminal of the first impedance matching circuit 3 is connected to a first terminal of the signal source 5. A first terminal of the second impedance matching circuit 4 is connected to a third terminal of the first impedance matching circuit 3, and a second terminal of the second impedance matching circuit 4 is grounded. A second terminal of the signal source 5 is grounded.

In this embodiment, the foregoing grounding may be understood as being connected to a main floorboard of a communications terminal. The first antenna radiator 1 may include a first end 12 and a second end 13. The first end 12 may be an end away from the slot, the first end 12 is grounded, and the second end 13 is an end close to the slot. The second antenna radiator 2 may include a first end 21 and a second end 22. The first end 21 may be an end away from the slot, the first end 21 is grounded, and the second end 22 is an end close to the slot. It should be noted that there is an interval between the feed point 11 on the first antenna radiator 1 and an end that is of the first antenna radiator 1 and that is grounded, so that a problem that an antenna fails due to a connection between the feed point 11 and the end of the first antenna radiator 1 that is grounded can be avoided.

In this embodiment, a width of the slot may be generally from 0.3 mm to 2.5 mm, and a typical value may be 1.5 mm. The slot is used for coupling and feeding, to transmit antenna energy to the second antenna radiator 2. The first specific value may be a proper value. A specific value may be selected based on actual required precision. This is not limited in this embodiment. That an absolute value of a difference between a length of the second antenna radiator 2 and a ¼ wavelength of a third frequency band is less than a first specific value may be understood as that the length of the second antenna radiator 2 is close to a ¼ wavelength of a 5 GHz frequency band of wireless fidelity (WIFI) (WIFI5G) (namely, the third frequency band), and a resonance mode H3 (that is, a resonance in a frequency band from 5.15 GHz to 5.85 GHz) may be generated. The length of the second antenna radiator 2 may be generally from 3 mm to 8 mm (the size is a size applied to the communications terminal, and an actual length of the ¼ wavelength varies in different media), and a typical value may be 5 mm. It should be noted that the foregoing description of the size specifically refers to a case of being applied to the WIFI5G. When the size is applied to different frequency bands, a specific size needs to be adjusted correspondingly. This is not limited in this embodiment, and still falls within the protection scope of this embodiment.

In this embodiment, the first impedance matching circuit 3 may include an inductor and a capacitor connected in parallel, and a capacitor connected in series. Alternatively, the first impedance matching circuit 3 may include two sub-circuits connected in parallel, and include one capacitor connected in series. One of the sub-circuits includes a plurality of inductors connected in series, and the other sub-circuit includes a plurality of capacitors connected in parallel.

In this embodiment, the second impedance matching circuit 4 may include two sub-circuits connected in parallel, where one sub-circuit includes one inductor, and the other sub-circuit includes one capacitor and one inductor. Alternatively, the second impedance matching circuit 4 may include one inductor and one capacitor connected in parallel.

In this way, due to the existence of the first impedance matching circuit 3 and the second impedance matching circuit 4, impedance at the signal source 5 can be enabled to be close to impedance that needs to be matched. For example, through the first impedance matching circuit 3 and the second impedance matching circuit 4, the impedance at the signal source 5 can be pulled near 50 ohm, so that the 50 ohm impedance of the signal source 5 can be better matched, a voltage standing wave ratio of an antenna is reduced, and a heat loss of a matching circuit is reduced, thereby improving antenna performance. Because of the foregoing matching circuit, a ratio of a resonance frequency of a second resonance mode to a resonance frequency of a first resonance mode can be less than 2. The resonance frequency of the first resonance mode is a frequency corresponding to a point with a minimum antenna voltage standing wave ratio in the first resonance mode, and the resonance frequency of the second resonance mode is a frequency corresponding to a point with a minimum antenna voltage standing wave ratio in the second resonance mode. The resonance frequency of the first resonance mode is from 1.55 GHz to 1.62 GHz, and the resonance frequency of the second resonance mode is from 2.4 GHz to 2.5 GHz.

In addition, the length of the second antenna radiator 2 is less than the length of the first antenna radiator 1, and the absolute value of the difference between the length of the second antenna radiator and the ¼ wavelength of the third frequency band is less than the first specific value. The second antenna radiator 2 is equivalent to an additional coupling branch of the antenna, and resonates in the WIFI5G. A radiation performance contradiction between H3 (that is, a resonance in a frequency band from 5.15 GHz to 5.85 GHz) and H1 (that is, a resonance in a frequency band from 1.55 GHz to 1.62 GHz)/H2 (that is, a resonance in a frequency band from 2.4 GHz to 2.5 GHz) caused by lengths of the feed point 11 and the second end 13 may be resolved. The second antenna radiator 2 may generate a resonance mode H3, and under impedance matching adjustment between the first impedance matching circuit 3 and the second impedance matching circuit 4, antenna efficiency of a WIFI5G frequency band (from 5.15 GHz to 5.85 GHz) can be improved.

Figure 2:
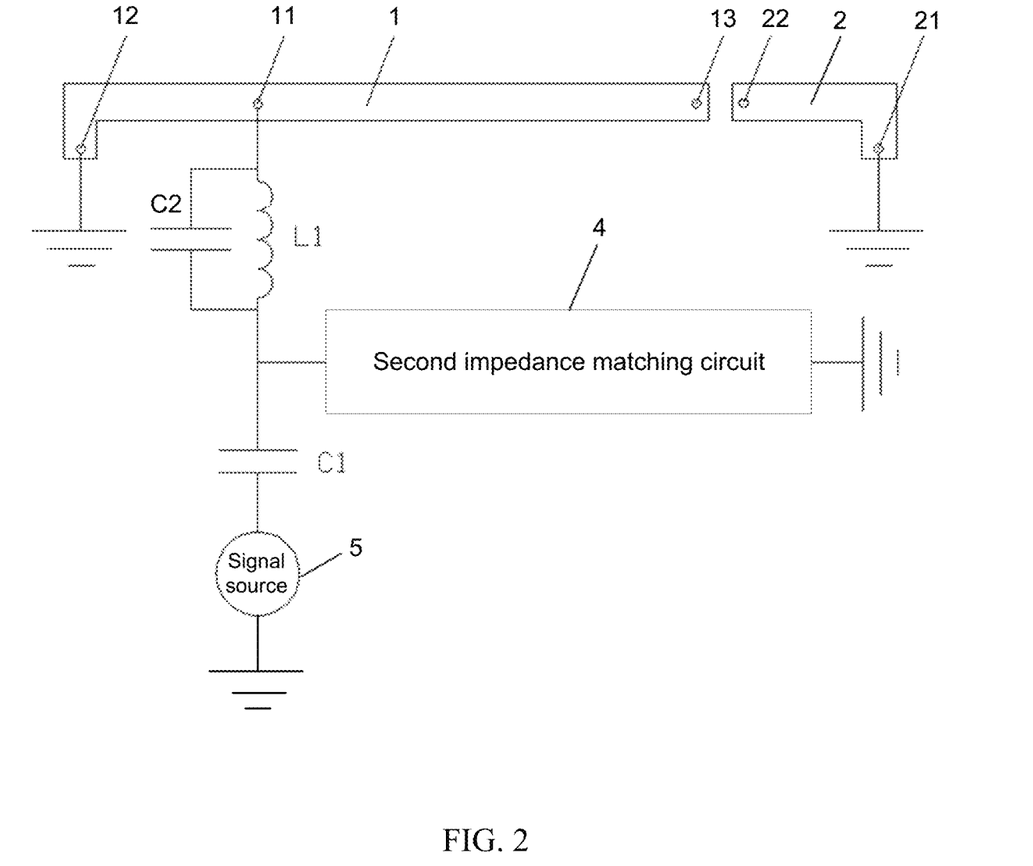
FIG. 2 is a schematic structural diagram 2 of an antenna structure according to an embodiment of the present disclosure.

Optionally, the first impedance matching circuit 3 includes a first inductor L1, a first capacitor C1, and a second capacitor C2;
  a first terminal of the first inductor L1 is connected to the feed point 11, and a second terminal of the first inductor L1 is connected to a first terminal of the first capacitor C1;
  a first terminal of the second capacitor C2 is connected to the feed point 11, and a second terminal of the second capacitor C2 is connected to the first terminal of the first capacitor C1; and
  a second terminal of the first capacitor C1 is connected to a first terminal of the signal source 5.

To better understand the foregoing setting manner, referring to FIG. 2, FIG. 2 is a schematic structural diagram of an antenna structure according to an embodiment of the present disclosure. As shown in FIG. 2, the first impedance matching circuit 3 includes the first inductor L1 and the second capacitor C2 that are connected in parallel, the first terminal of the first inductor L1 is connected to the feed point 11, and the second terminal of the first inductor L1 is connected to the first terminal of the first capacitor C1. The first terminal of the second capacitor C2 is connected to the feed point 11, and the second terminal of the second capacitor C2 is connected to the first terminal of the first capacitor C1. The second terminal of the first capacitor C1 is connected to the first terminal of the signal source 5.

In this implementation, a magnitude of the second capacitor C2 may be from 0.3 pf to 1.2 pf, a typical value may be 0.7 pf, and is equivalent to a non-high impedance in the WIFI5G, so that a WIFI5G signal can pass effectively. In addition, the second capacitor C2 has a specified impedance matching adjustment function for the WIFI5G.

Figure 3:
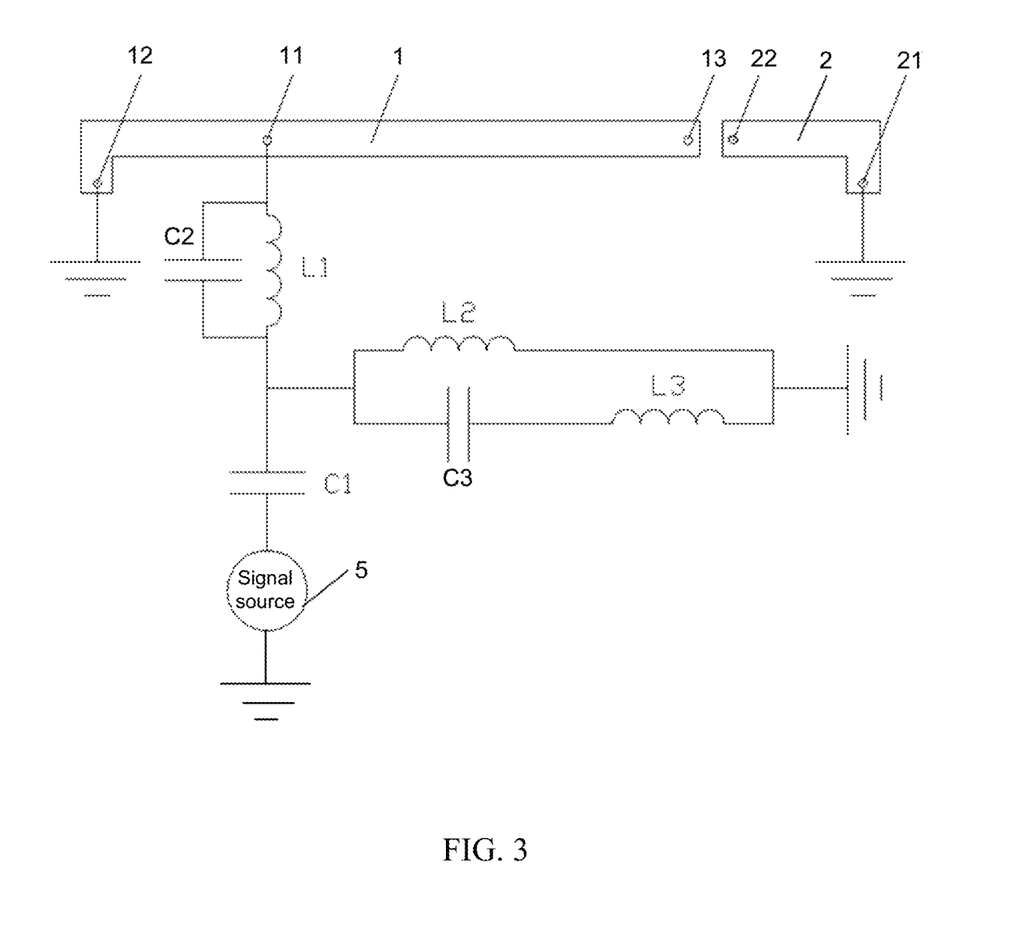
FIG. 3 is a schematic structural diagram 3 of an antenna structure according to an embodiment of the present disclosure.

Optionally, the second impedance matching circuit 4 includes a second inductor L2, a third capacitor C3, and a third inductor L3;
  a first terminal of the second inductor L2 is connected to the second terminal of the first inductor L1, and a second terminal of the second inductor L2 is grounded;
  a first terminal of the third capacitor C3 is connected to the second terminal of the first inductor L1, and a second terminal of the third capacitor C3 is connected to a first terminal of the third inductor L3; and
  a second terminal of the third inductor L3 is grounded.

To better understand the foregoing setting manner, referring to FIG. 3, FIG. 3 is a schematic structural diagram of an antenna structure according to an embodiment of the present disclosure. As shown in FIG. 3, the first terminal of the second inductor L2 is connected to the second terminal of the first inductor L1, and the second terminal of the second inductor L2 is grounded. The first terminal of the third capacitor C3 is connected to the second terminal of the first inductor L1, and the second terminal of the third capacitor C3 is connected to the first terminal of the third inductor L3. The second terminal of the third inductor L3 is grounded.

In this implementation, the third inductor L3 may be from 2 nH to 8 nH, a typical value may be 4 nH, and is equivalent to a non-low impedance in the WIFI5G. Due to the existence of the second capacitor C2 and the third inductor L3, high-impedance filtering functions of the first inductor L1 and the third capacitor C3 are damaged, so that a WIFI5G signal can pass effectively. In addition, the second capacitor C2 and the third inductor L3 have a specified impedance matching adjustment function for the WIFI5G, so that antenna performance is further improved.

Figure 4:
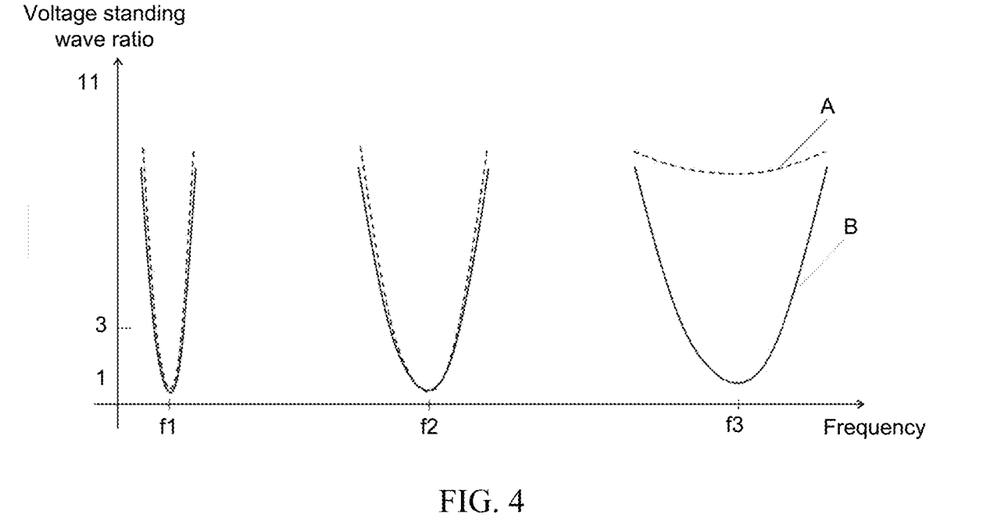
FIG. 4 is a schematic comparison diagram of a voltage standing wave ratio of an antenna structure according to an embodiment of the present disclosure.

Referring to FIG. 4, FIG. 4 is a schematic comparison diagram of a voltage standing wave ratio of an antenna structure according to an embodiment of the present disclosure. In FIG. 4, a dashed line A represents a voltage standing wave ratio of an antenna without the second capacitor C2 and the third inductor L3, and a solid line B represents a voltage standing wave ratio of an antenna after the second capacitor C2 and the third inductor L3 are added. It can be learned that an antenna mismatch loss of the WIFI5G is significantly improved, while a positioning frequency band (from 1.55 GHz to 1.62 GHz) and a WIFI2.4G frequency band (from 2.4 GHz to 2.5 GHz) are not greatly changed.

Figure 5:
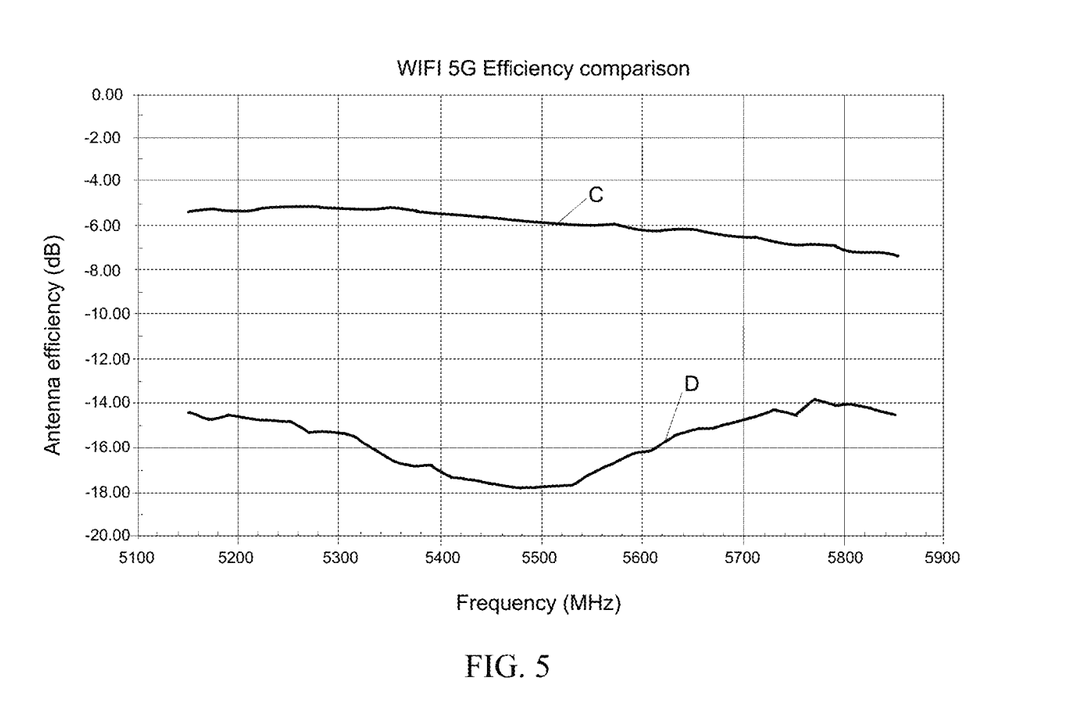
FIG. 5 is a schematic diagram of efficiency comparison of an antenna structure according to an embodiment of the present disclosure.

Under a same antenna space condition, such as a full-screen communications terminal, a distance between an antenna and a reference ground is about 1.2 mm (commonly known as an antenna clearance distance). The length of the first antenna radiator 1 is 20 mm, and the length of the second antenna radiator 2 is about 5 mm. Referring to FIG. 5, FIG. 5 is a schematic diagram of efficiency comparison of an antenna structure according to an embodiment of the present disclosure. A solid line C represents antenna efficiency after the second capacitor C2 and the third inductor L3 are added (an average value is about −5.9 dB), and a solid line D represents antenna efficiency without the second capacitor C2 and the third inductor L3 (an average value is about −15.6 dB). In this case, antenna efficiency of a WIFI5G frequency band (from 5.15 GHz to 5.85 GHz) is increased by 9.7 dB on average. An antenna efficiency difference between the positioning frequency band (from 1.55 GHz to 1.62 GHz) and the WIFI2.4G frequency band (from 2.4 GHz to 2.5 GHz) is less than 0.5 dB, and therefore is not included in FIG. 5.

The first impedance matching circuit 3 and the second impedance matching circuit 4 in this implementation may be further applied to a case in which a main antenna (from 0.7 GHz to 0.96 GHz or from 1.71 GHz to 2.69 GHz) shares a same antenna with the WIFI5G. For example, the first impedance matching circuit 3 and the second impedance matching circuit 4 are configured to generate two resonance modes of a low frequency band (from 0.7 GHz to 0.96 GHz) and a medium frequency band (from 1.71 GHz to 2.17 GHz) or two resonance modes of a low frequency band (from 0.7 GHz to 0.96 GHz) and a high frequency band (from 2.3 GHz to 2.69 GHz), or may be configured to generate two resonance modes of a medium frequency band (from 1.71 GHz to 2.17 GHz) and a high frequency band (from 2.3 GHz to 2.69 GHz), and further generate a third resonance mode of the WIFI5G. Only the length of the first antenna radiator 1, a length between the feed point 11 and the second end 13, and a width of the slot need to be appropriately adjusted, and a value of an impedance matching circuit (the first impedance matching circuit 3 or the second impedance matching circuit 4) needs to be adjusted accordingly. In addition, the WIFI5G may also be replaced with an ultra-high frequency hand such as from 3.3 GHz to 3.8 GHz or from 4.4 GHz to 5.0 GHz.

For example, if three resonance modes of a low frequency band (from 0.7 GHz to GHz), a high frequency band (from 2.3 GHz to 2.69 GHz), and the WIFI5G (from 5.15 GHz to 5.85 GHz) are generated, the length of the first antenna radiator 1 is increased near a ¼ wavelength of a low frequency band, such as 40 mm, and the length between the feed point 11 and the second end 13 is less than a ⅜ wavelength of the high frequency band (from 2.3 GHz to 2.69 GHz). The length may be generally from 0 mm to 18 mm, and a typical value may be 15 mm. The length of the second antenna radiator 2 is close to a ¼ wavelength of the WIFI5G, such as 5 mm. In addition, the third inductor L3 is properly adjusted to 4 nH, the second capacitor C2 is properly adjusted to 0.7 pf, and the second inductor L2 is properly adjusted to 2 nH.

Optionally, the third frequency band is from 5.15 GHz to 5.85 GHz, or from 3.3 GHz to 3.8 GHz, or from 4.4 GHz to 5.0 GHz.

In this embodiment, the frequency band from 5.15 GHz to 5.85 GHz may be referred to as a WIFI5G frequency band, and the third frequency band may be from 5.15 GHz to GHz, or from 3.3 GHz to 3.8 GHz, or from 4.4 GHz to 5.0 GHz.

Figure 6:
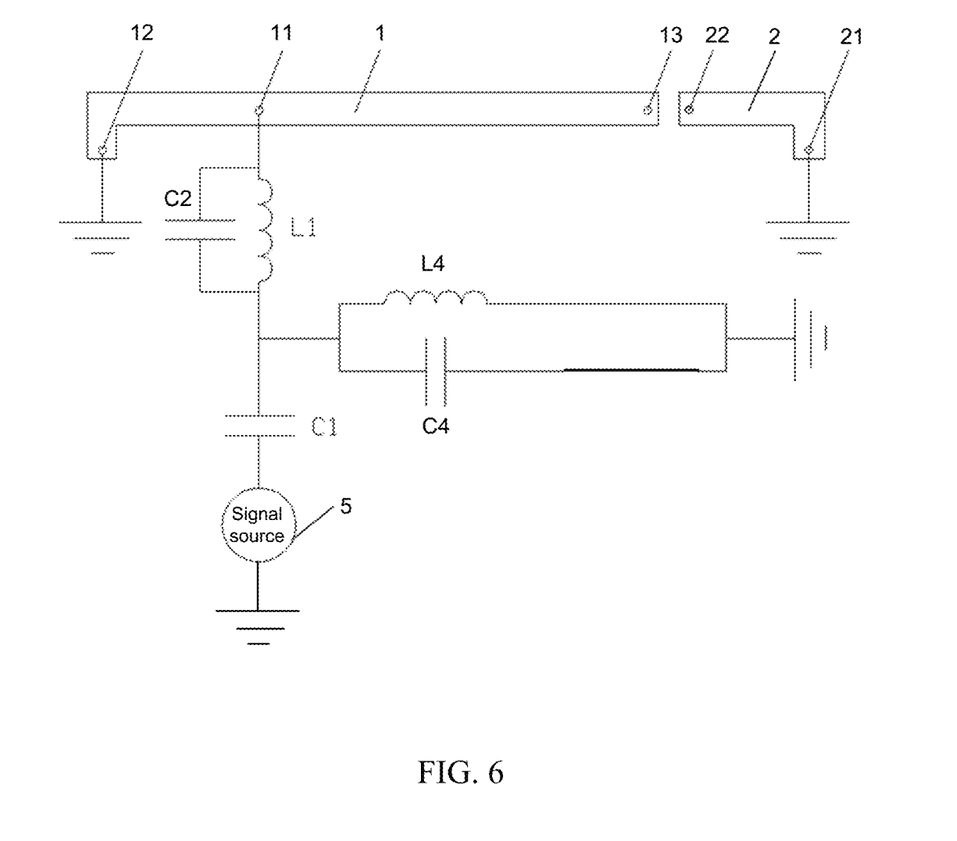
FIG. 6 is a schematic structural diagram 4 of an antenna structure according to an embodiment of the present disclosure.

Optionally, the second impedance matching circuit 4 includes a fourth inductor L4 and a fourth capacitor C4;
  a first terminal of the fourth inductor L4 is connected to the second terminal of the first inductor L1, and a second terminal of the fourth inductor L4 is grounded; and
  a first terminal of the fourth capacitor C4 is connected to the second terminal of the first inductor L1, and a second terminal of the fourth capacitor C4 is grounded.

To better understand the foregoing setting manner, referring to FIG. 6, FIG. 6 is a schematic structural diagram of an antenna structure according to an embodiment of the present disclosure. As shown in FIG. 6, the fourth capacitor C4 is directly connected to the fourth inductor L4 in parallel, and there is no inductor connected to the fourth capacitor C4 in series. Due to a magnitude of the fourth capacitor C4 and an actual situation of a circuit, there may be no inductor connected to the fourth capacitor C4 in series. In this way, the circuit can be simplified, a circuit failure probability can be reduced, and costs of the communications terminal can also be saved.

Optionally, ratio of a first length to a second length is greater than 1/20, the first length is a length between the feed point 11 and the end of the first antenna radiator 1 that is grounded, and the second length is a length of the first antenna radiator 1.

In this embodiment, the ratio of the first length to the second length is greater than 1/20, so that a requirement of antenna impedance matching can be better met, thereby improving antenna performance.

Optionally, the length between the feed point 11 and the end of the first antenna radiator 1 that is grounded is less than a length between the feed point 11 and the slot.

In this embodiment, the length between the feed point 11 and the end of the first antenna radiator 1 that is grounded is less than the length between the feed point 11 and the slot, so that impedance matching can be performed better, thereby improving antenna performance.

Optionally, a width of the slot is from 0.3 mm to 2.5 mm.

In this embodiment, the width of the slot is from 0.3 mm to 2.5 mm, and a typical value may be 1.5 mm. The width of the slot may be determined based on a coupling amount of the first antenna radiator 1 and the second antenna radiator 2. For example, the width of the slot may be determined based on a coupling amount between a part that is between the feed point 11 and the second end 13 of the first antenna radiator 1, and the second antenna radiator 2. Therefore, the width of the slot is determined based on the coupling amount, so that a coupling effect between the first antenna radiator 1 and the second antenna radiator 2 can be better.

Optionally, a magnitude of the second capacitor C2 is from 0.3 pf to 1.2 pf.

In this implementation, the magnitude of the second capacitor C2 is from 0.3 pf to 1.2 pf, and a typical value may be 0.7 pf. The magnitude of the second capacitor C2 may be determined based on the third frequency band.

Optionally, a magnitude of the third inductor L3 is from 2 nH to 8 nH.

In this implementation, the magnitude of the third inductor L3 is from 2 nH to 8 nH, and a typical value may be 4 nH. The magnitude of the third inductor L3 may be determined based on the third frequency band.

Optionally, the antenna structure is a portion of a metal frame or a metal housing of a communications terminal, or is a metal body disposed in a housing of a communications terminal.

In this implementation, the antenna structure is a portion of the metal frame or the metal housing of the communications terminal, or is the metal body disposed in the housing of the communications terminal. This may be selected based on an actual situation, to meet a suitable setting manner. In addition, the metal body may be a flexible printed circuit (FPC), laser direct structuring (LDS), magnesium alloy, stainless steel, or the like.

The antenna structure in this embodiment of the present disclosure includes a first antenna radiator 1, a second antenna radiator 2, a first impedance matching circuit 3, a second impedance matching circuit 4, and a signal source 5. The first antenna radiator 1 is coupled to the second antenna radiator 2 through a slot, an end of the first antenna radiator 1 away from the slot is grounded, a feed point 11 is disposed on the first antenna radiator 1, an end of the second antenna radiator 2 away from the slot is grounded, a length of the first antenna radiator 1 is greater than a length of the second antenna radiator 2, and an absolute value of a difference between a length of the second antenna radiator 2 and a ¼ wavelength of a third frequency band is less than a first specific value. A first terminal of the first impedance matching circuit 3 is connected to the feed point 11, and a second terminal of the first impedance matching circuit 3 is connected to a first terminal of the signal source 5. A first terminal of the second impedance matching circuit 4 is connected to a third terminal of the first impedance matching circuit 3, and a second terminal of the second impedance matching circuit 4 is grounded. A second terminal of the signal source 5 is grounded. In this way, due to the existence of the second antenna radiator 2, the first impedance matching circuit 3, and the second impedance matching circuit 4, a voltage standing wave ratio of an antenna can be reduced, and a heat loss of a matching circuit can be reduced, thereby improving antenna performance.

An embodiment of the present disclosure further provides a communications terminal, including the foregoing antenna structure.

In this embodiment, the communications terminal may be, for example, a mobile phone, a tablet personal computer, a laptop computer, a personal digital assistant (PDA), a mobile Internet device (MID), or a wearable device.

It should be noted that, in this specification, the terms "include", "comprise", or their any other variant is intended to cover a non-exclusive inclusion, so that a process, a method, an article, or an apparatus that includes a list of elements not only includes those elements but also includes other elements which are not expressly listed, or further includes elements inherent to such process, method, article, or apparatus. An element limited by "includes a . . . " does not, without more constraints, preclude the presence of additional identical elements in the process, method, article, or apparatus that includes the element.

The embodiments of the present disclosure are described above with reference to the accompanying drawings, but the present disclosure is not limited to the above specific implementations, and the above specific implementations are only illustrative and not restrictive. Under the enlightenment of the present disclosure, those of ordinary skill in the art can make many forms without departing from the purpose of the present disclosure and the protection scope of the claims, all of which fall within the protection of the present disclosure.

What is claimed is:

1. An antenna structure, comprising a first antenna radiator, a second antenna radiator, a first impedance matching circuit, a second impedance matching circuit, and a signal source, wherein the first antenna radiator is coupled to the second antenna radiator through a slot, an end of the first antenna radiator away from the slot is grounded, a feed point is disposed on the first antenna radiator, an end of the second antenna radiator away from the slot is grounded, a length of the first antenna radiator is greater than a length of the second antenna radiator, and an absolute value of a difference between the length of the second antenna radiator and a ¼ wavelength of a third frequency band is less than a first specific value;

a first terminal of the first impedance matching circuit is connected to the feed point, and a second terminal of the first impedance matching circuit is connected to a first terminal of the signal source;

a first terminal of the second impedance matching circuit is connected to a third terminal of the first impedance matching circuit, and a second terminal of the second impedance matching circuit is grounded; and a second terminal of the signal source is grounded;

wherein:

the first impedance matching circuit comprises a first inductor, a first capacitor, and a second capacitor;

a first terminal of the first inductor is connected to the feed point, and a second terminal of the first inductor is connected to a first terminal of the first capacitor;

a first terminal of the second capacitor is connected to the feed point, and a second terminal of the second capacitor is connected to the first terminal of the first capacitor; and a second terminal of the first capacitor is connected to the first terminal of the signal source.

2. The antenna structure according to claim 1, wherein the second impedance matching circuit comprises a second inductor, a third capacitor, and a third inductor;
- a first terminal of the second inductor is connected to the second terminal of the first inductor, and a second terminal of the second inductor is grounded;
- a first terminal of the third capacitor is connected to the second terminal of the first inductor, and a second terminal of the third capacitor is connected to a first terminal of the third inductor; and
- a second terminal of the third inductor is grounded.

3. The antenna structure according to claim 2, wherein the third frequency band is from 5.15 GH to 5.85 GHz, or from 3.3 GH to 3.8 GHz, or from 4.4 GH to 5.0 GHz.

4. The antenna structure according to claim 1, wherein the second impedance matching circuit comprises a fourth inductor and a fourth capacitor;
- a first terminal of the fourth inductor is connected to the second terminal of the first inductor, and a second terminal of the fourth inductor is grounded; and
- a first terminal of the fourth capacitor is connected to the second terminal of the first inductor, and a second terminal of the fourth capacitor is grounded.

5. The antenna structure according to claim 1, wherein a ratio of a first length to a second length is greater than 1/20, the first length is a length between the feed point and the end of the first antenna radiator that is grounded, and the second length is the length of the first antenna radiator.

6. The antenna structure according to claim 5, wherein the length between the feed point and the end of the first antenna radiator that is grounded is less than a length between the feed point and the slot.

7. The antenna structure according to claim 1, wherein a width of the slot is from 0.3 mm to 2.5 mm.

8. The antenna structure according to claim 1, wherein a magnitude of the second capacitor is from 0.3 pf to 1.2 pf.

9. The antenna structure according to claim 2, wherein a magnitude of the third inductor is from 2 nH to 8 nH.

10. The antenna structure according to claim 1, wherein the antenna structure is a portion of a metal frame or a metal housing of a communications terminal, or is a metal body disposed in a housing of a communications terminal.

11. A communications terminal, comprising an antenna structure, wherein the antenna structure comprises a first antenna radiator, a second antenna radiator, a first impedance matching circuit, a second impedance matching circuit, and a signal source;
- the first antenna radiator is coupled to the second antenna radiator through a slot, an end of the first antenna radiator away from the slot is grounded, a feed point is disposed on the first antenna radiator, an end of the second antenna radiator away from the slot is grounded, a length of the first antenna radiator is greater than a length of the second antenna radiator, and an absolute value of a difference between the length of the second antenna radiator and a 1/4 wavelength of a third frequency band is less than a first specific value;
- a first terminal of the first impedance matching circuit is connected to the feed point, and a second terminal of the first impedance matching circuit is connected to a first terminal of the signal source;
- a first terminal of the second impedance matching circuit is connected to a third terminal of the first impedance matching circuit, and a second terminal of the second impedance matching circuit is grounded; and
- a second terminal of the signal source is grounded;

wherein:
- the first impedance matching circuit comprises a first inductor, a first capacitor, and a second capacitor;
- a first terminal of the first inductor is connected to the feed point, and a second terminal of the first inductor is connected to a first terminal of the first capacitor;
- a first terminal of the second capacitor is connected to the feed point, and a second terminal of the second capacitor is connected to the first terminal of the first capacitor; and
- a second terminal of the first capacitor is connected to the first terminal of the signal source.

12. The communications terminal according to claim 11, wherein the second impedance matching circuit comprises a second inductor, a third capacitor, and a third inductor;
- a first terminal of the second inductor is connected to the second terminal of the first inductor, and a second terminal of the second inductor is grounded;
- a first terminal of the third capacitor is connected to the second terminal of the first inductor, and a second terminal of the third capacitor is connected to a first terminal of the third inductor; and
- a second terminal of the third inductor is grounded.

13. The communications terminal according to claim 12, wherein the third frequency band is from 5.15 GH to 5.85 GHz, or from 3.3 GH to 3.8 GHz, or from 4.4 GH to 5.0 GHz.

14. The communications terminal according to claim 11, wherein the second impedance matching circuit comprises a fourth inductor and a fourth capacitor;
- a first terminal of the fourth inductor is connected to the second terminal of the first inductor, and a second terminal of the fourth inductor is grounded; and
- a first terminal of the fourth capacitor is connected to the second terminal of the first inductor, and a second terminal of the fourth capacitor is grounded.

15. The communications terminal according to claim 11, wherein a ratio of a first length to a second length is greater than 1/20, the first length is a length between the feed point and the end of the first antenna radiator that is grounded, and the second length is the length of the first antenna radiator.

16. The communications terminal according to claim 15, wherein the length between the feed point and the end of the first antenna radiator that is grounded is less than a length between the feed point and the slot.

17. The communications terminal according to claim 11, wherein a width of the slot is from 0.3 mm to 2.5 mm.

18. The communications terminal according to claim 11, wherein a magnitude of the second capacitor is from 0.3 pf to 1.2 pf.

19. The communications terminal according to claim 12, wherein a magnitude of the third inductor is from 2 nH to 8 nH.

20. The communications terminal according to claim 11, wherein the antenna structure is a portion of a metal frame or a metal housing of a communications terminal, or is a metal body disposed in a housing of a communications terminal.

* * * * *